(12) United States Patent
Deakins et al.

(10) Patent No.: US 7,853,364 B2
(45) Date of Patent: Dec. 14, 2010

(54) ADAPTIVE CONTROLLER FOR ION SOURCE

(75) Inventors: James D. Deakins, Fort Collins, CO (US); Dennis J. Hansen, Loveland, CO (US); Leonard J. Mahoney, Fort Collins, CO (US); Tolga Erguder, Fort Collins, CO (US); David M. Burtner, Belmont, MA (US)

(73) Assignee: Veeco Instruments, Inc., Plainview, NY (US)

( * ) Notice: Subject to any disclaimer, the term of this patent is extended or adjusted under 35 U.S.C. 154(b) by 464 days.

(21) Appl. No.: 11/947,720

(22) Filed: Nov. 29, 2007

(65) Prior Publication Data
US 2008/0129209 A1    Jun. 5, 2008

Related U.S. Application Data

(60) Provisional application No. 60/868,034, filed on Nov. 30, 2006.

(51) Int. Cl.
*G06F 19/00* (2006.01)

(52) U.S. Cl. .................. 700/289; 250/424; 315/111.81; 315/111.91

(58) Field of Classification Search .................. 700/289; 250/424; 315/111.91, 111.81
See application file for complete search history.

(56) References Cited

U.S. PATENT DOCUMENTS 4,349,868 A * 9/1982 Brown .......................... 700/37
4,743,767 A * 5/1988 Plumb et al. .............. 250/492.2
4,862,032 A * 8/1989 Kaufman et al. .......... 313/359.1
5,423,970 A * 6/1995 Kugler ................... 204/298.03
5,475,354 A    12/1995 Valentian et al.
5,973,447 A * 10/1999 Mahoney et al. ......... 313/359.1
6,002,208 A    12/1999 Maishev et al.
6,608,431 B1    8/2003 Kaufman
6,919,690 B2    7/2005 Siegfried et al.
2005/0034811 A1 * 2/2005 Mahoney et al. ....... 156/345.24
2005/0248284 A1    11/2005 Burtner et al.
2007/0194245 A1    8/2007 Yevtukhov et al.

FOREIGN PATENT DOCUMENTS

WO    2007127897 A2    11/2007

OTHER PUBLICATIONS

Skogestad, Sigurd and Postlethwaite, Ian, "Multivariable Feedback Control-Analysis and Design," Chapter 3, "Introduction to Multivariable Control," pp. 63-112, Copyright 1996, John Wiley & Sons Ltd., West Sussex, England.

* cited by examiner

*Primary Examiner*—Michael D Masinick
(74) *Attorney, Agent, or Firm*—Hensley Kim & Holzer, LLC

(57) ABSTRACT

An ion source, often used for materials processing applications in a vacuum processing chamber, is provided with an adaptive control system. The adaptive control system has a microprocessor and memory that regulate the inputs of power and gas flow into the ion source. The adaptive control system monitors and stores the dynamic input impedance properties and status of input devices to the ion source. The adaptive control system may additionally control magnetic fields within the ion source. The adaptive control system provides a multivariable control for driving any combination of input power, gas flow, magnetic field, or electrostatic ion beam extraction or acceleration field into the ion source.

40 Claims, 12 Drawing Sheets

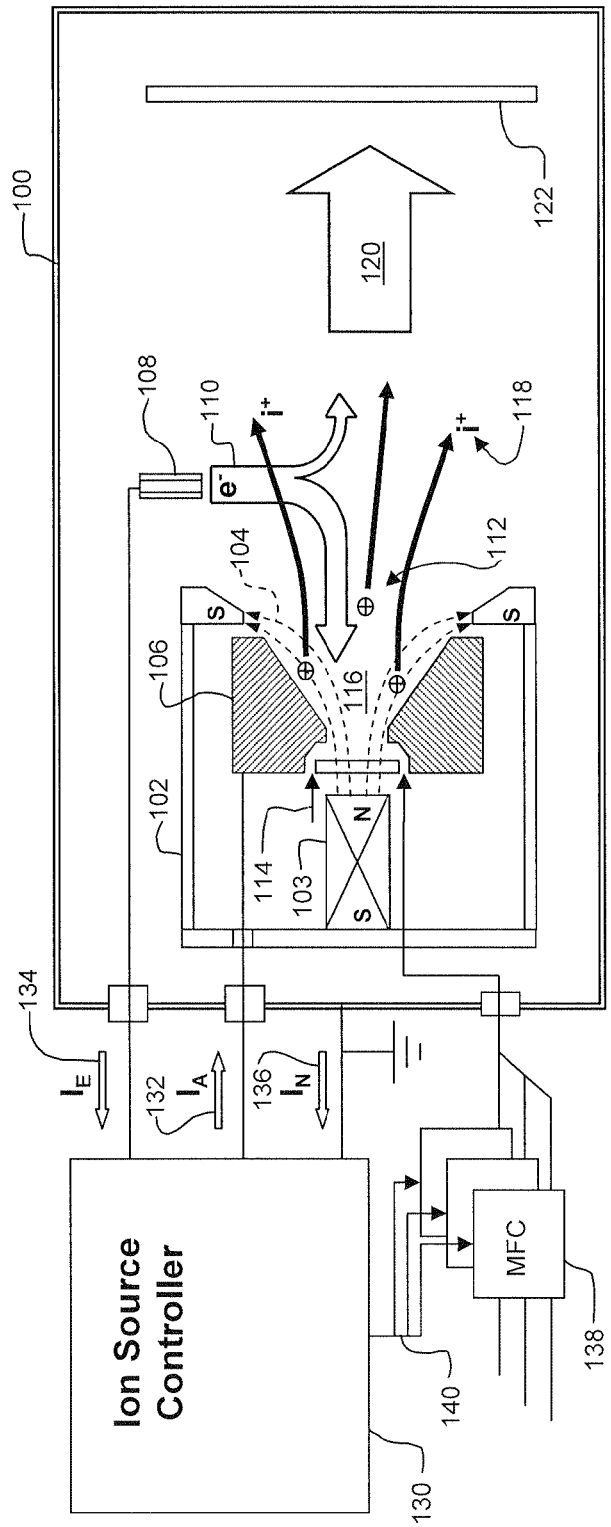
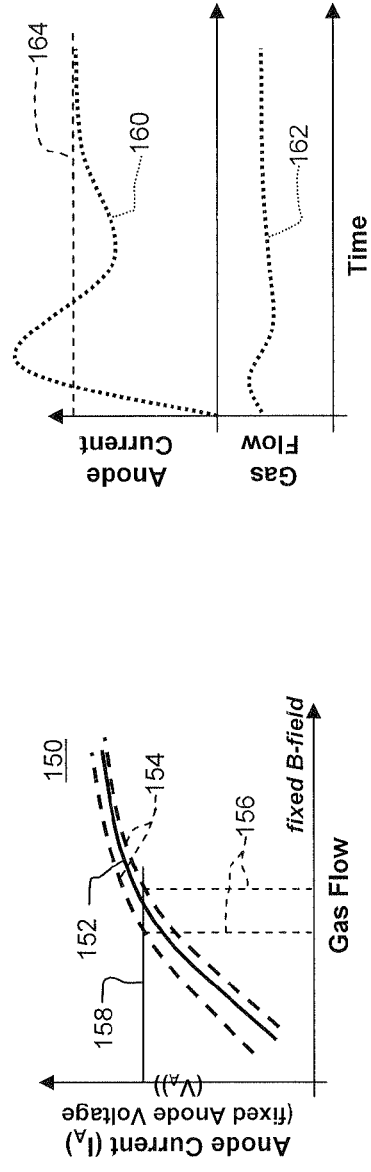
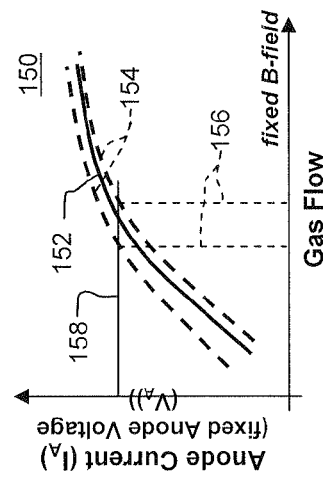
Fig. 1A (Prior Art)
Fig. 1B (Prior Art)
Fig. 1C (Prior Art)

ADAPTIVE CONTROLLER FOR ION SOURCE

CROSS REFERENCE TO RELATED APPLICATIONS

The present application claims the benefit of priority pursuant to U.S.C. §119(e) of U.S. provisional application No. 60/868,034 filed 30 Nov. 2006 entitled "Adaptive controller for ion source," which is hereby incorporated by reference herein in its entirety.

TECHNICAL FIELD

This technology relates to operation, monitoring, and control of ion beam sources and their dynamic operation when used in materials processing applications.

BACKGROUND

Broad-area ion sources are widely used in vacuum-based materials processing applications. Such ion sources can include ion beam extraction and acceleration grid optics to produce an ion beam with a relatively narrow range of ion energy. The ion sources often have features to help control spatial and charged-state attributes of the ion beam such as beam current density or flux, uniformity or spread, divergence or focus, and neutralization. Broad-area ion sources also include gridless ion sources such as Hall-current or closed-drift ion sources, anode-layer ion sources, and so-called end-Hall ion sources. These ion sources typically use a magnetic field to assist an accelerating space charge in proximity to an anode that accelerates ions with typically higher current fluxes than that achieved with gridded ion sources. Such sources are differentiated from small aperture ion beam sources such as those used in analytical spectroscopy work, high-energy physics or high-energy ion implantation.

Broad-area ion beams serve a wide variety of terrestrial materials processing applications including ion milling, surface etching, texturing, and pre-cleaning in order to pattern, produce, or "grow" various surface structures or alter surface properties. Such ion sources are also used in a host of direct or indirect thin film deposition processes including ion beam physical vapor sputter deposition, direct film deposition (e.g., silicon-carbon based or diamond-like carbon coatings), or as an energetic ion assist to magnetron, e-beam evaporator, or secondary ion beam deposition processes for the formation of either conductive or dielectric films. An example of a broad-area ion beam assist process may include the electron-beam deposition of silicon-, aluminum-, tantalum-, or titanium-bearing compounds onto an optical substrate while impinging the same substrate with an $O_2$ ion beam from either a gridded or gridless ion source in order to produce films with high optical index and clarity and with controlled material properties such as adhesion, stress, or density. Another example of the use of broad-area ion beam for materials processing may include the use of a linear gridded or gridless ion source for surface treatment of moving architectural glass substrates undergoing vacuum-based processing, or metal or polymer films in a vacuum web-coating system. In such instances the broad-area ion beam(s) can be used for surface cleaning, texturing, deposition assist, surface chemistry activation, or the formation or growth of nano-structures.

Most gridded and gridless ion source work by introducing a gas or evaporated compound into the ion source body and forming an electrically conductive gas discharge or plasma in order to derive charged ion species and states. Special power supplies are often required to deliver and control the level of power into the gas discharge to maintain a stable state and concentration of charged-particles (or ions). However, the steady state performance and beam output of the ion source is also highly dependent upon other input and system state factors such as the input gas flow, magnetic fields, electrostatic fields, electron emission element states, localized gas pressure(s), the net power density disposed into the gas discharge, and any emission or neutralization currents used to control volume or surface charging. Furthermore, the relation of the source output to any input factor can be influenced by the environmental factors such as the condition of the vacuum chamber, working geometry scale, emission of materials, or temperature and conductivity of wall boundaries. As such, the working states and environment of ion beam sources are not necessarily fixed nor is the relationship between input and output states time-invariant or independent of the working environment. For this reason, it is often necessary to include closed-loop control and performance regulation features into the operation of broad-area ion sources to maintain a consistent operating state of the ion source and output ion beam properties when used in manufacturing.

A "closed-loop" system generally refers to a system that takes a signal from an output and feeds the signal to an input (e.g., a feedback loop) to correct system performance. With respect to an ion source, examples of important input variables include gas flows, vacuum pressure, power (currents and voltages), magnetic fields, and reference voltages or currents such as primary or secondary emission currents. Examples of output variables include a measure of the ion beam current (or current density) directly or, as in most cases, the discharge current, voltage or impedance state, and any neutralization current. As in any control system, the system state relating inputs and outputs can be characterized by some transfer function that governs amplitude and temporal states of the system. For closed-loop control, the system also requires a feed-back loop that can be characterized by a feed-back function, mechanism, circuit, or algorithm that incorporates closed-loop control parameters (i.e., gain, delay, or phase). The system can be a single variable system (i.e., single input and output) or multivariate system. (A more detailed reference on the analysis, design and application of control systems is available in Ellis, *Control System Design Guide*, Academic Press (1992). Also, details on the analysis and application of multivariate closed-loop control and feed-back conditioning is available in Skogestad and Postlethwaite, *Multivariable Feedback and Control, Analysis and Design*, John Wiley and Sons (1996).

The current closed-loop control systems commonly used for broad-beam ion sources utilize feedback to one or two control variable inputs such as input gas flow and certain electron emission current or input voltages. In these known implementations, the control systems use fixed, closed-loop parameters that must serve the wide domain of the operation, scale, and installation environment of the ion source and unknown, time-variant behaviors for different process conditions. If the parameters need to be varied to improve dynamic operation, empirical work must be performed to identify and verify the efficacy of any new closed-loop parameters.

SUMMARY

An adaptive control system for a power supply to an ion source, often used for materials processing applications in a vacuum processing chamber, is disclosed herein. In one form, the adaptive control system has a microprocessor and memory that regulate the inputs of power and gas flow into the ion source. The adaptive control system may also be capable of monitoring and storing the dynamic input impedance properties and status of input devices to the ion source. The adaptive control system may also provide control for inputting gases into the ion source or any other part of the sub-system within the vacuum processing chamber. The adaptive control system may additionally provide control for driving magnetic fields within the ion source. The adaptive control system may further provide a multivariable control for driving any combination of input power, gas flow, magnetic field, or electrostatic ion beam extraction or acceleration field into the ion source.

The adaptive control system may employ a collection of equations, numerically based algorithms, or parameterized relationships that may be used for closed-loop control of ion source response through feedback of power supply (i.e., voltage and/or current) and gas flow inputs. The adaptive control system may further employ an adaptive mode of closed-loop control operations, wherein an operator uses and analyzes the monitored dynamic ion source responses and subsequently makes adjustments to at least one of the parameters in the equations, algorithms, or relationships used for closed-loop control. The adaptive control system may be integrated into the power supply or may be a separate controller of the ion source. The functions of the adaptive control system declared above may be electronically embedded in software or firmware and carried out by a microprocessor in the power supply or controller. Alternately, the adaptive control system may be implemented via circuitry, either exclusively or in conjunction with a microprocessor implementing software instructions. Hereinafter in this document, the term "circuitry" is meant to refer to implementations of the control system using either circuits, a microprocessor, or a combination of both.

The adaptive control system may invoke any viable method of single variable or multivariate analysis of the closed-loop control parameters and related selection rules or conditions to provide adaptive, closed-loop control. Optimized control parameters may be dynamically preset by an external request to the controller before placing the ion source into a known vacuum processing chamber installation or exposing it to a known change in process step, operation, or other process event.

The adaptive control system provides closed-loop control parameters that can be learned and adapted automatically by the ion source controller and applied either sequentially or in real time. The adaptive control system also provides closed-loop, dynamic control of the ion source that is faster than can be provided by conventional gas flow closed-loop control approaches and that also utilizes fixed control parameters. The adaptive control system further allows for improved dynamic control and faster time-response that must be overcome during ion source ignition, step-wise process transitions, unexpected physical disruptions of the process, and numerous sources of temporal variability of the process environment that are inherent most manufacturing vacuum process systems.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various embodiments and implementations as further illustrated in the accompanying drawings and defined in the appended claims.

BRIEF DESCRIPTION OF THE DRAWINGS

FIG. 1A is a schematic illustration of a prior art broad-beam ion source control system within a material processing system.

FIG. 1B is an illustrative plot of a fixed, closed-loop control that adjusts the input gas flow over a local range to maintain a target value of anode current in the prior art broad-beam ion source control system of FIG. 1A.

FIG. 1C is an illustrative plot showing the effect of a change in gas flow on anode current and the lag time to reach a steady state in the prior art broad-beam ion source control system of FIG. 1A.

DETAILED DESCRIPTION

Figure 2:
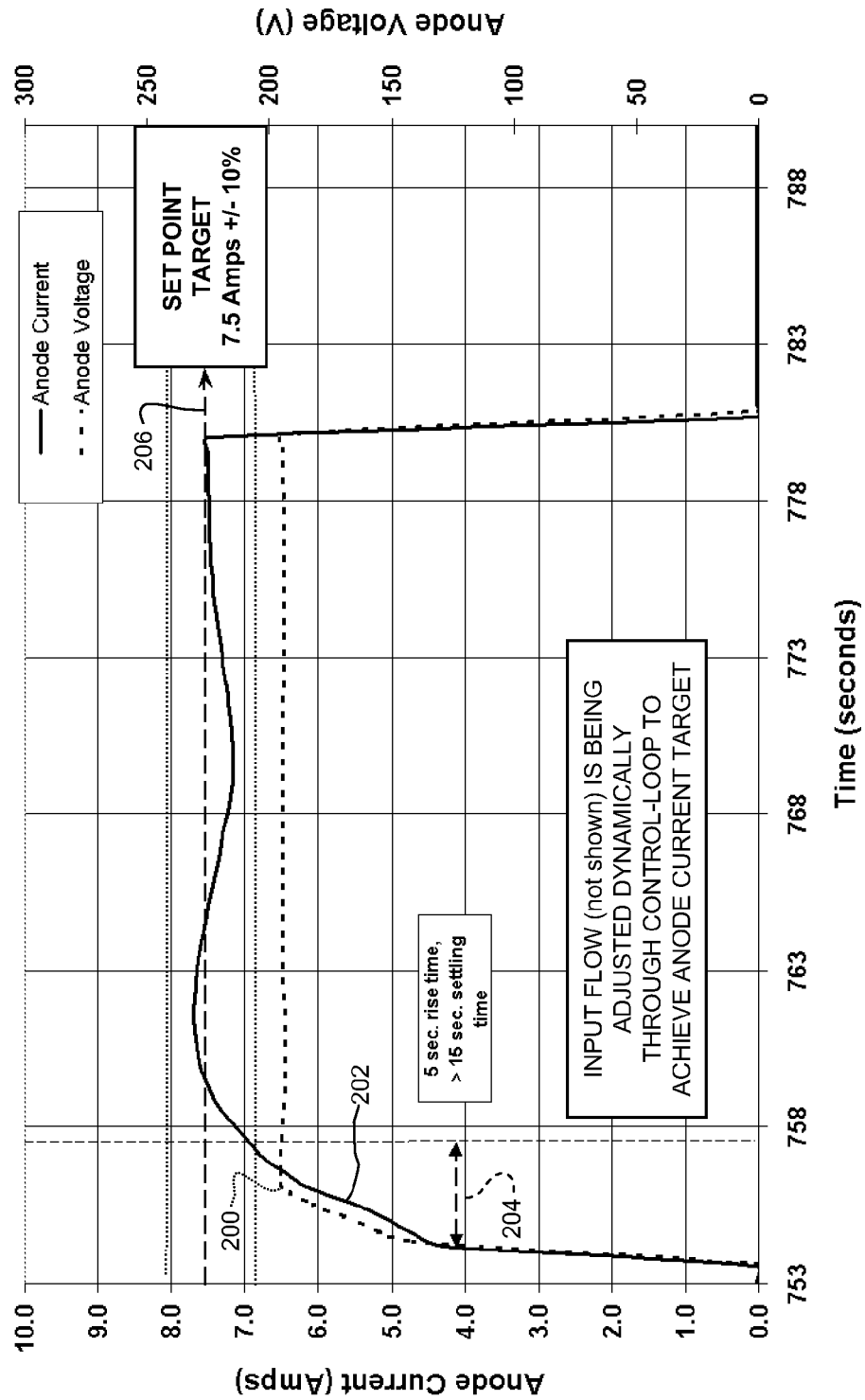
FIG. 2 is an illustrative plot of the dynamic response of a prior art ion source (an end-Hall ion source in this example) showing step-wise "on" operation and resulting anode voltage and discharge current response when using fixed, closed-loop control parameters.

One known broad-area ion source that uses closed-loop control is an end-Hall ion source and ion source controller as illustrated in FIG. 1. In this example, a material processing vacuum system 100 uses an end-Hall ion source 102 to produce a broad-area ion beam. Such sources have been described by Kaufman et al. in U.S. Pat. No. 4,862,032, by Kaufman et al. in U.S. Pat. No. 6,608,431, and Burtner et al. in U.S. patent application Ser. No. 11/061,245. A magnet 103 in the ion source 102 creates a diverging magnetic field 104 in close proximity to an angular or conically shaped anode 106. An electron source 108 (such as a hot filament cathode electron emitter or hollow-cathode electron source) provides 'primary' electrons 110 that are accelerated to the anode opening wherein a gas discharge 112 is produced. The source is fed with input gases 114 that are injected primarily into the center of the anode. The mobility of the primary electrons is limited by the magnetic field at the anode and, as a result, a space charge 116 forms within the gas discharge 112 in proximity to the anode. Ions (i+)118 are generated near the anode 106 are then accelerated outwardly from the anode through this "gridless" space charge 116 potential and form a relatively self-neutralized ion beam 120. The ion beam may then be used work on the downstream substrate or target surface 122 for any of a variety of materials processing purposes, for example, as described in the Background section above. While we provide an example of an end-Hall source in FIG. 1, the model of use is similar with other gridless ion sources such as closed-drift ion sources akin those described by Mahoney et al. in U.S. Pat. No. 5,973,447 and related references, and anode layer sources similar to those described by Mashiev et al. in U.S. Pat. No. 6,002,208 and by Siegfried et al. in U.S. Pat. No. 6,919,690.

External to the exemplary gridless ion source is an ion source controller 130 that supplies voltage to both the anode 106 and cathode electron emission element 108 of the ion source 100 driving particular anode current $(I_A)$ 132 and cathode emission current $(I_E)$ 134 respectively, as well as any system neutralization current $(I_N)$ 136. The power supply may be either current-, voltage-, or power-regulated and may include any combination of DC, AC, or RF conditioning (continuously applied or pulse-modulated) of the input power to electrically drive any element of the ion source (e.g., anode, cathode, induction coil, wire-filament, hollow-cathode, evaporator, antenna, or microwave cavity). The ion source controller 130 may include at least one mass flow controller (MFC) 138 or at least one connection 140 to an external MFC. The MFC 138 injects gases into the ion source 100 and material processing chamber. In conventional practice, it is known that the rate of injected gas and the gas composition greatly influence the neutral pressure, charged-particle density, and collisional dynamics of ion source discharge.

As shown in FIG. 1B, there is a fairly deterministic relationship between the gas flow and net impedance properties of the ion source 102 at a particular power level. For a gridless ion source this is shown in the typical operating relationship 150 between gas flow and anode current $(I_A)$ for a fixed anode voltage $(V_A)$ As the gas flow increases, the trend line 152 in $I_A$ increases. However, when installation changes or temporal variations arise, the relationship between gas flow and $I_A$ may encompass a bounded range 154. This variable relationship between gas flow and $I_A$ can be exploited to better target the input power to the ion source that so strongly dictates its output performance.

In the example of the end-Hall ion source 100 of FIG. 1, the ion source controller 130 may deliver power with a voltage regulated DC supply to the anode 106. The ion source controller 130 constrains the power delivered to the ion source 102 through a closed-loop that adjusts the input gas flow over a local range 156 in order to maintain a local impedance state of the discharge and thereby obtain and control any specific target value of anode current 158. Similarly, FIG. 1C illustrates how adjustment of gas flow 162 over time regulates anode current 160 to achieve a target value 164. Note the lag time to reach a steady state anode current 160 in the prior art ion source control system of FIG. 1A. This is an artifact of the gas transport constants between the MFCs 138 and the working ion source plasma 112 and plasma space charge 116, which is on the order of 1-10 seconds in most applications.

FIG. 2 illustrates an example of the response of a typical end-Hall ion source (e.g., as depicted in FIG. 1) with a prior art closed-loop control method governing the power supply. In this example, emphasis is placed on the dynamic control of anode current (given fixed anode voltage regulation) since the downstream ion beam current density, to the first order, is directly proportional to the anode current within most gridless ion sources. Before step-wise start-up of the ion source, an initial, pre-set gas flow is established to the ion source. After ignition, there is a response time of the ion source anode voltage 200 and a lagging anode current response 202. As reflected in the plot, the closed-loop ion source controller increases the gas flow to render the discharge more conductive and drive the current upward. Through these gas flow adjustments (not shown) the rise time of the anode current response 204 is controlled to a few seconds. However, there is often a longer settling time as the anode current reaches its target steady state value 206. The exact behavior of the response depends upon the ion source properties, the input gas composition, the nature of the step-wise input, and the global process chamber conditions. In known systems, the gain and phase settings of the closed-loop or control loop are fixed in time or are discretely adjusted for different process system installations. Similar results may be achieved for ion source operation controlling other variables, e.g., fixed anode voltage, regulated anode voltage, net power, or gas flow, wherein the closed-loop operates on the other free input variables for control of the ion source plasma state.

One of the problems with the known ion source controller features and practice is the limitation of any fixed set of closed-loop control parameters within the ion source controller. The ion source and controller may be installed in any number of different chambers with varying boundaries and vacuum pumping capacities. Process chambers feature elements such as downstream sources of process gases, flow controllers, baffles and shutters, close-proximity moving substrates, or additional process subsystems (e.g., evaporators, magnetrons, and secondary ion sources). These can all interact with and influence the behavior of the ion source. Thus, the static and dynamic relationship between gas flow and ion source impedance is not invariant for all process systems and is not time-invariant when multiple processes steps with varying gas mixtures are used.

As an example, the specific relationship 150 of anode voltage, anode current and gas flow, as illustrated in FIG. 1B, is not necessarily the same for all scales of ion sources, user process gases, operating ranges and process chambers. Moreover, it is rarely time invariant within real production systems which are prone to drifting and inherent variability. Because of this system and process variability, the selection of any one fixed set of closed-loop control parameters does not insure well-conditioned ion source responses.

For example, when one set of control parameters is used, the response to one particular input gas and set of initial conditions may work well for one operating state, but may produce an under-damped or over-damped response for another set of initial input conditions, in-process disruptive event, or process step transition. Moreover, closed-loop control parameters that work well for ion source start-up (i.e., step-function input) may not be ideal when an operating ion source experiences in-process disruptions or perturbations such as the movement of a local mechanical shutter, an arc, the operation of another plasma device, or the repeated movement of a large substrate within close proximity to the output of the source.

Figure 3A:
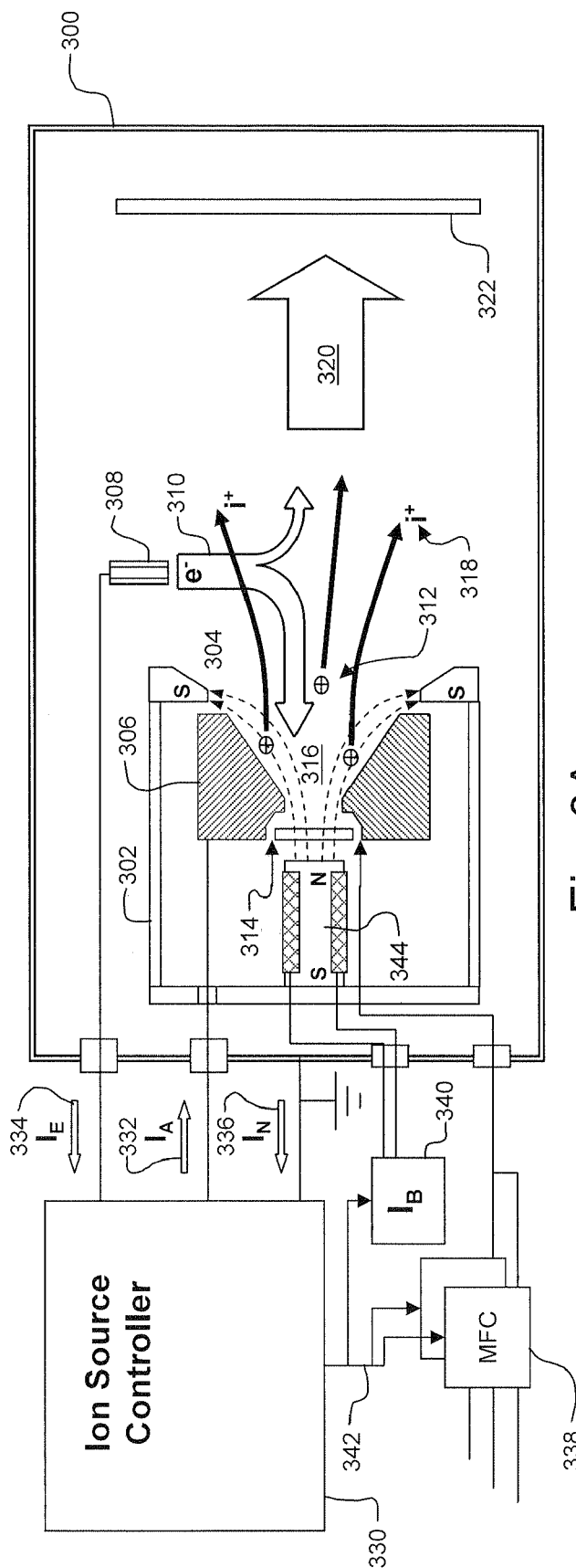
FIG. 3A is a schematic illustration of a broad-beam ion source control system within a material processing system using an electromagnet as the basis of the closed-loop control.

One approach to overcome the limitations of sluggish response of the closed-loop control and the adaptability to different process systems is to use an electromagnet as the basis of the closed-loop control rather than gas flow. To illustrate, FIG. 3A shows a material processing vacuum chamber 300 that uses an end Hall ion source 302, a divergent magnetic field 304, an anode 306, and an electron source 308 (e.g., a cathode electrode) for primary electrons 310 to produce an ionized gas discharge 312 from input gases 314. The space charge 316 resulting from the electrons 310 held within the magnetic field produces and accelerates the ions 318 to form the downstream ion beam 320 to perform work on the target or substrate 322. The ion source controller 330 in FIG. 3A drives the anode current $I_A$ 332, cathode current $I_E$ 334 and neutralization current $I_N$ 336 also communicates with the input gas MFCs 338 and an additional electromagnet current supply $I_B$ 340 through control lines 342. The $I_B$ current supply 340 drives one or more electromagnet elements 344 to support the magnetic field 304 within the ion source 342.

Figure 3B:
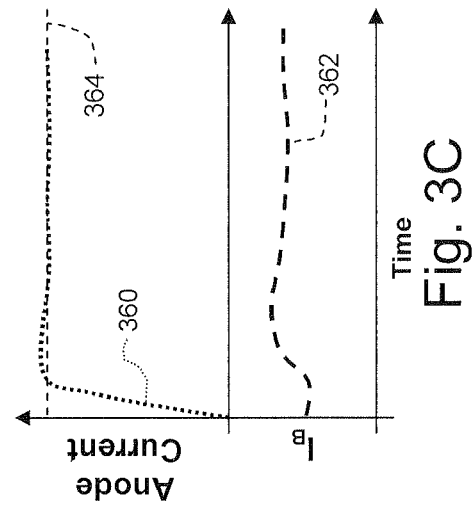
FIG. 3B is an illustrative plot depicting the relationships of both input gas flow and current to the electromagnet to the anode current in the fixed, closed-loop control system for the broad-beam ion source control system of FIG. 3A.

FIG. 3B shows relationships 350 of both input gas flow 352 and $I_B$ current 344 to the electromagnet 354 to $I_A$ for a fixed $V_A$. The trend line 352 for anode current $I_A$ with respect to increasing gas flow (increasing anode current for increasing gas flow) runs counter to that of the trend line 354 for anode current $I_A$ with respect to electromagnet current $I_B$ (decreasing anode current for increasing electromagnetic current, which is proportional to the magnetic field strength).

Figure 3C:
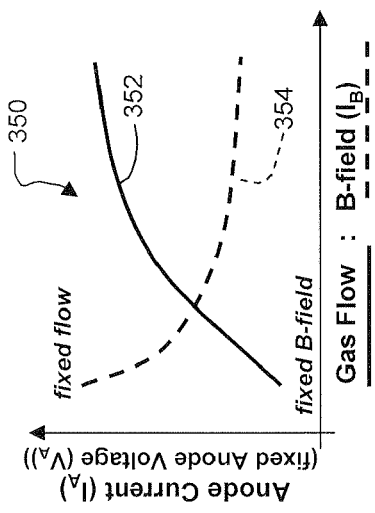
FIG. 3C is an illustrative plot of a fixed, closed-loop control that adjusts the current to the electromagnet to maintain a target value of anode current in the prior art broad-beam ion source control system of FIG. 3A.

In many cases, the use of an electromagnet 344 and $I_B$ current driver 340 provides an alternative and more responsive control variable to support closed-loop control. As shown in FIG. 3C, very short response times in dynamic anode current 360 can be realized when compared to the relatively transport time of gas through the MFCs 338. The time response using electromagnet current variation 362 is almost instantaneously reflected in its influence on the gas discharge 312 and space charge 316 and thus can bring the anode current to its desired target 364 more quickly. This approach has considerable advantage over other methods in those process systems where variation in background gas pressure (as brought about by input gas variation) can negatively impact process results.

FIG. 4 illustrates an implementation of an ion source controller 400 with an embedded adaptive, closed-loop control system. The control parameters are adaptable during real-time operation of an ion source within a material processing system in order to provide a more stable ion source output response at start-up and with respect to any changes or disruptions in process steps, settings, or conditions (collectively, "process changes"). The controller 400 contains one or more power supply modules 402 with connections 404 for power delivery to the broad-beam ion source 406. In addition, the controller may incorporate any internal or external power supply control 407 for an electromagnet. The ion source 406 may be placed in a vacuum processing chamber 410 in which the output ion beam 408 may perform work on a downstream substrate or workpiece 412.

The illustration of FIG. 4 reflects a gridless ion source with user inputs 420 of anode voltage $I_V$, anode current $I_A$, cathode emission current $I_E$, and ion beam system neutralization current $I_N$. The ion source controller 400 may also provide input control signals 414 to one or more ion source MFCs 416. Initial setpoints 422 of any number of input gas flows at t=0 to the MCSs 416 may be used at the beginning of ignition of the ion source or a process step. The MFCs 416 deliver working gases to the ion source 406 and, for some process methodologies, to a process gas manifold line 417 downstream of the ion source 406 (e.g., a downstream deposition precursor gas injection manifold). Response data 418 for any particular MFC or electromagnet driver 418 may be read back to the controller 400. Instrument signals (analog, digital, wired, or wireless) from any in situ vacuum process sensors 424 (e.g., ion property sensors, optical monitors, residual gas-analyzer, and film property sensors) may also be read back to the controller 400.

It is common practice to provide an ion source controller (i.e., a power supply and control sub-system) that is capable of supporting multiple ion source apparatus of varying scale or different models and furthermore to use these combinations of controller and ion source apparatus for a variety of processes and place these combinations into widely varying or changing environments (collectively, "the system environment"). Under such circumstances, fixed closed-loop control parameters cannot guarantee stable, well-regulated dynamic operation of the ion source output properties and considerable effort is required to empirically identify suitable combinations of fixed closed-loop control parameters.

Figure 4A:
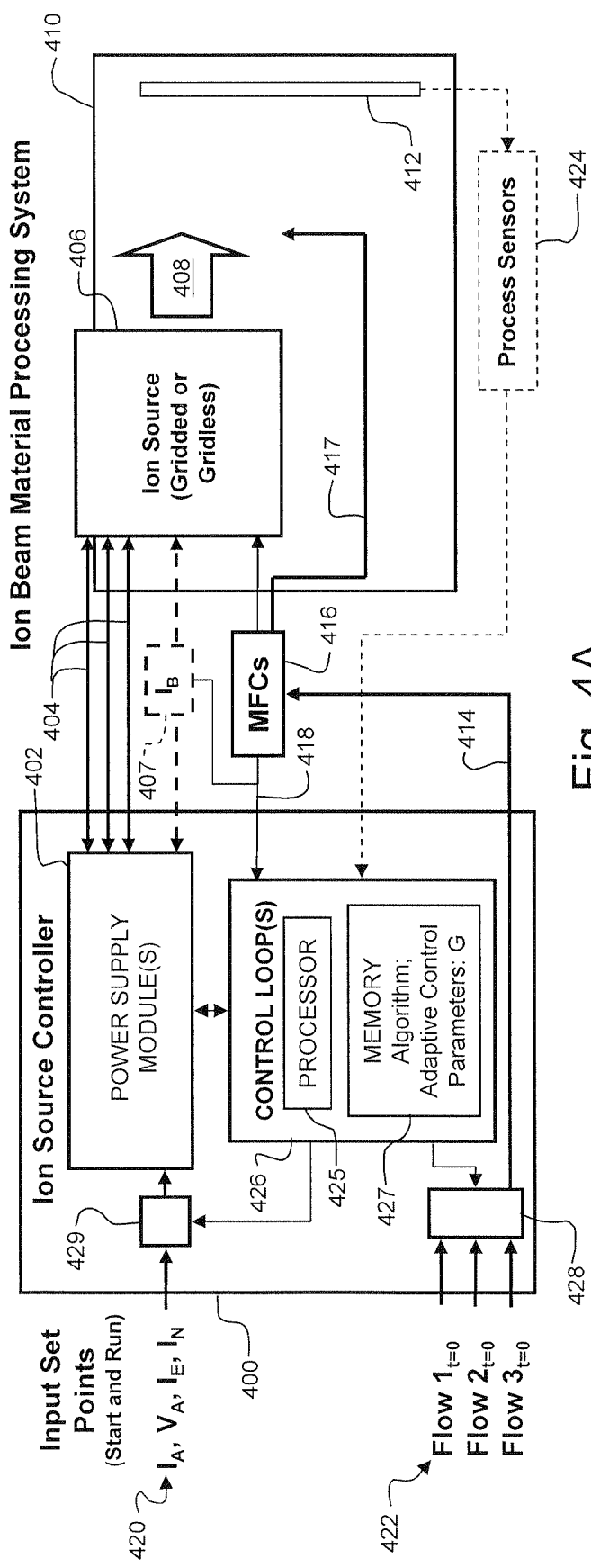
FIG. 4A is a schematic illustration of one implementation of an ion beam control system with an adaptive, closed-loop control using embedded, adaptable adjustments to closed-loop control parameters (G).
Figure 4B:
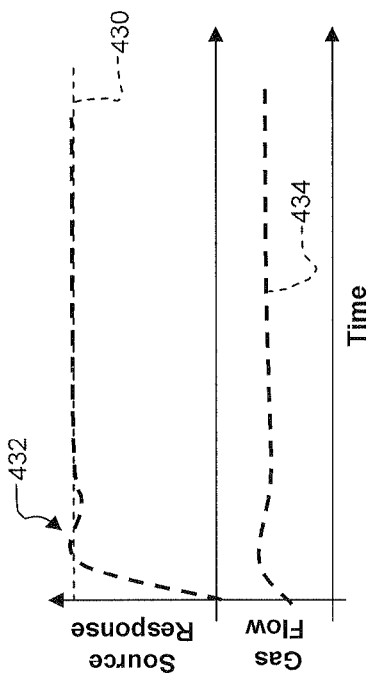
FIG. 4B is an illustrative plot of a dynamic response of an ion source under the adaptive, closed-loop control system of FIG. 4A.

The ion source controller 400 of FIG. 4 includes an adaptable, closed-loop, control module 426 that may include a microprocessor 425 and other circuitry. In general the control module 426 makes input adjustments 428 to the setpoints for input gas flow(s) and/or the power inputs 429 for the electromagnet drive 407 or other components of the ion source 406. These input adjustments are made based upon feedback detected by the control module and according to a control algorithm stored in the memory 427 (e.g., in firmware) in order to improve the dynamic performance of the output response(s) 430 of the ion source 406. Performance may be measured through the condition of the power supply modules 402 or external, in situ vacuum process monitors 424. As shown in FIG. 4B, a feature of this control algorithm is its ability to automatically make adjustments to its internal loop conditioning parameters, G (e.g., gain, phase, discrete time step or delay, proportional-integral-differential (PID) loop parameters, and multivariate matrix control parameters), in real time and to improve the output responses 430 of the ion source 406 (or any in situ process monitor 424 response) through significant transient events 432 by using feedback detected by the control module 426 by controlled adjustments to one or more ion source inputs 434.

The automatic adjustments to the control loop parameters may be made through either a "learn mode" in order to adapt to a specific transition, e.g., ion source ignition or process step changes, or in a continuous, real-time mode in order to perpetually adapt to changes in process conditions or any potentially disruptive event. Further, while the adaptive, closed-loop ion source control is illustrated in FIG. 4A for a gridless broad-area ion source wherein the input gas flow may be adjusted, the adaptive, closed-loop control system may also be applied to any ion source or any single or multivariate combination of ion source inputs and measured output responses or states.

While FIGS. 1-3 provided an example of controlling the discharge or beam current from a gridless ion source, the closed-loop control approaches discussed can be applied to the output properties of gridded ion sources. In gridded sources, a main chamber, which receives an input gas flow, is used to form a gas discharge by applying electrical power through any combination of direct current (DC) (in any of the anode, cathode, or filament), an alternating current (AC) electrode, a radio frequency (RF) electrode, or a microwave power coupling apparatus. The plasma body that is formed within the chamber is bounded by an electrostatic ion beam extraction, acceleration, and focusing grid system that is used in conjunction with multiple power supplies to from the output ion beam. A detailed background on gridded ion sources and ion beam extraction systems have been described by Forrester, *Large Ion Beams—Fundamentals of Generation and Propagation*, John Wiley & Sons (1988).

Often the grid extraction systems employed in these ion sources have multiple conductive plates (grids) with multiple ion extraction holes set at different electrical potentials to extract ions from a plasma, accelerate the ions into a combined stream of ions, and thereby form a broad-area ion beam for treatment of larger surface areas. In most gridded ion sources, the ion source apparatus or system includes an electron source neutralizer that is purposed to inject a stream of free electrons into the pathway or volume of the ion beam downstream of the ion beam grid extraction system. The electron source neutralizer (for example, in the form of a hot filament, a DC or RF hollow cathode, or plasma bridge) serves an important purpose in maintaining a well-collimated or focused ion beam and in mitigating charge build-up to downstream workpieces in the path of the ion beam. As with the gridless ion sources, gridded ion sources are commonly susceptible to time-variant behavior (changes and process disruptions) or system environment conditions for which any number of input gas, input discharge power, and beam extraction potential adjustments are required to control various ion source output properties. As such, they can benefit from the use of the closed-loop control approaches discussed herein.

With respect to either gridless or gridded ion sources, there are many possible ion source output properties that may be subject to control. Practitioners are chiefly concerned about the ion beam energy spectrum and beam current density that directly relates to total beam current, ion flux, ion dosage, or net power to a workpiece. However, there are many other ion source output properties, working states, and characteristics that often can be subject to control through closed-loop feedback. For example, within either a gridless or gridded ion source, it is often helpful to use the discharge plasma impedance state or a referenced current response to a fixed input voltage as an ion source output response to one of the input power devices used to drive the ion source. This is a common practice in gridless ion sources where the output ion current is not measured directly by an input power supply, but inferred from the output load impedance state of the ion source. Within gridded sources the plasma formation in the ion source chamber is controlled separately but in conjunction with the acceleration of the ion beam through a grid extraction system.

In this discussion, any of a host of ion source properties and states are to be understood as the output property the ion source. For gridless ion sources, output properties may include, but are not limited to, the following:

a. Ion beam current, which may be any measure of a beam current flux density or total beam current, however measured or derived;
b. Ion source DC, AC, or RF current or voltage that is used to power or influence the discharge body;
c. The ion source DC, AC, RF, or microwave impedance as sensed by any input supply used to support the ion source operation; and
d. Ion source electron neutralization current or neutralization voltage, which refers to any measured source of electrons or resulting electrode surface potential within the process system that quantifies the output neutralization state of the ion beam source or collective system.

For gridded ion sources, output properties may include, but are not limited to, the following:

a. Ion beam current, which is any measure of a beam current flux density or total beam current drawn through the ion beam extraction system, however measured or derived;
b. Ion source DC, AC, or RF current or voltage that is used to power or influence the discharge body in the main chamber of the ion source;
c. The ion source DC, AC, RF, or microwave impedance as sensed by any input supply used to support the ion source operation; and
d. Ion source electron neutralization current or neutralization voltage which refers to any measured source of electrons or resulting electrode surface potential within the process system that quantifies the output neutralization state of the ion beam source or collective system.

Generic to either gridless or gridded ion source system is the application of in situ process sensor data 424 as illustrated in FIG. 4A as feedback data for closed-loop control. Typically these process sensors are mechanically separate from the ion source apparatus, but do in fact measure an output property or state of the ion source within the process system environment. Examples of such process sensors may include, but are not limited to, the following: any electrically active, inductive, Hall-effect, or floating probe or boundary that monitors ion current, energy, surface neutralization, or potentials in the processing system; microwave-based plasma or chemistry probes; optical-based process sensors (e.g., optical emission, infra-red emission or absorption, induced-emission or absorption spectroscopy, cavity-ring-down spectroscopy, in situ surface scattering, or ellipsometry); and gas pressure or gas phase sensors (e.g., mass spectroscopy or residual gas analyzers). Many of these process sensors have been used to identify and quantify output properties of the ion source that cannot be directly quantified by the output properties listed about. For example, ion beam currents or impedances do not provide information about the chemical composition or make-up or the ion beam output, whereas an optical emission monitor or mass spectrometer used as a process sensor could provide this additional information to enhance the control of the chemical composition state of the ion beam when encountering and attempting to correct for process changes or disruptions.

Figure 5:
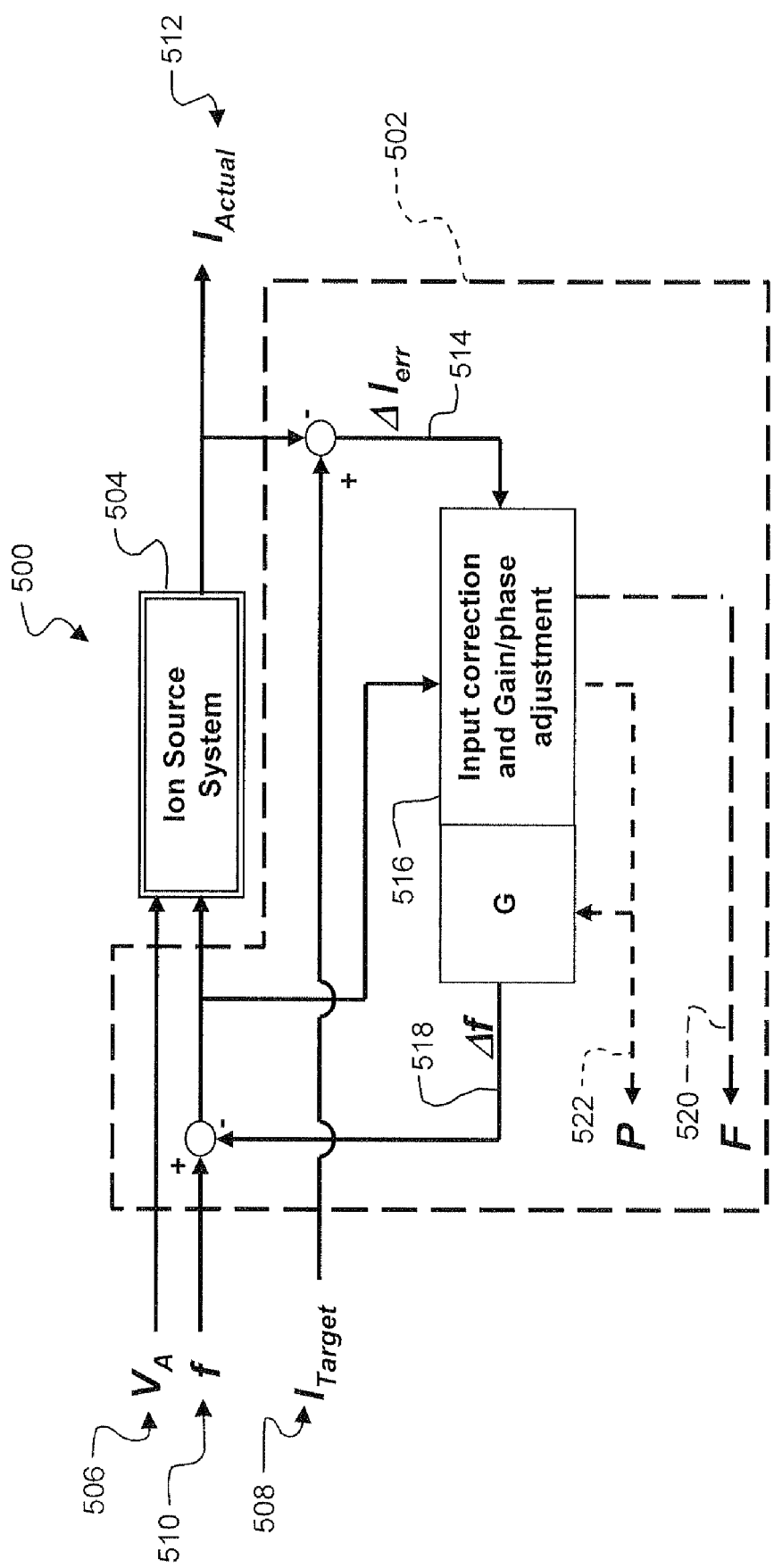
FIG. 5 is a schematic illustration of an implementation of an adaptive closed-loop control system employing embedded, adaptable adjustments to closed-loop control parameters.

FIG. 5 shows a system control schematic 500 that represents the operations of an exemplary embedded adaptive, closed-loop control module 502 for the ion source system 504. In this high-level system representation, the ion source system 504, upon which the algorithm of the adaptive, closed-loop control module 502 acts, comprises the power supply modules, flow controllers, and the ion source within the material processing vacuum chamber. Initial set-points for anode voltage $V_A$ 506, discharge current $I_{Target}$ 508, and gas flow f 510 are input to the controller 502. The adaptive, closed-loop algorithm of the control module 502 receives feedback and compares the actual discharge current $I_{Actual}$ 512 with the target value $I_{Target}$ 508 to form a response error $\Delta I_{ERR}$ 514.

The response error 514 is then analyzed by a correction module 516 that examines the response error 514 against a parametric model of the ion source system 504 in order to estimate and condition a feedback correction $\Delta f$ 518 to the input gas flow 510 (or alternatively to one of the power module inputs). The correction module 516 further examines the scale of the response error 514 and estimated feedback correction 518 in order to determine the following:

a. whether the response error 514 is due to a fault condition or event and alarm the user of such fault condition event, for example, by indicator or time-tagged message F 520;
b. whether the adaptive, closed-loop is un-responsive (i.e., the feedback gain $\Delta f$ is too low to effect a response) and increase the gain(s) of the adaptive, closed-loop to induce a stronger feedback response; and
c. whether the adaptive, closed-loop response is possibly ill-conditioned (i.e., under-damped or over-damped) for the given set of adaptive, closed-loop parameters G and make adaptive changes to the adaptive, closed-loop parameters G based on $\Delta I_{ERR}$ and $\Delta f$ to improve dynamic control.

In this manner, the adaptive, closed-loop parameters G are dynamically adjusted (against some boundaries and selection rules) in real time.

It is further possible to record and save learned values of the parameters, either discretely G or as a function of time G(t) after exposing the ion source system 504 to a commonly encountered and controlled process event such as ion source start-up with select initial conditions or process gas recipe change. These values may then be stored as preset adaptive, closed-loop conditions P 522 or P(t) (as a function of time) and re-entering these preset values 522 when the controlled event is re-encountered within the same or similar material processing system. Such a record of preset values P or P(t) also has particular value when troubleshooting specific installations of the ion source or when matching or duplicating multiple installations of like ion beam processing systems within manufacturing systems.

Figure 6:
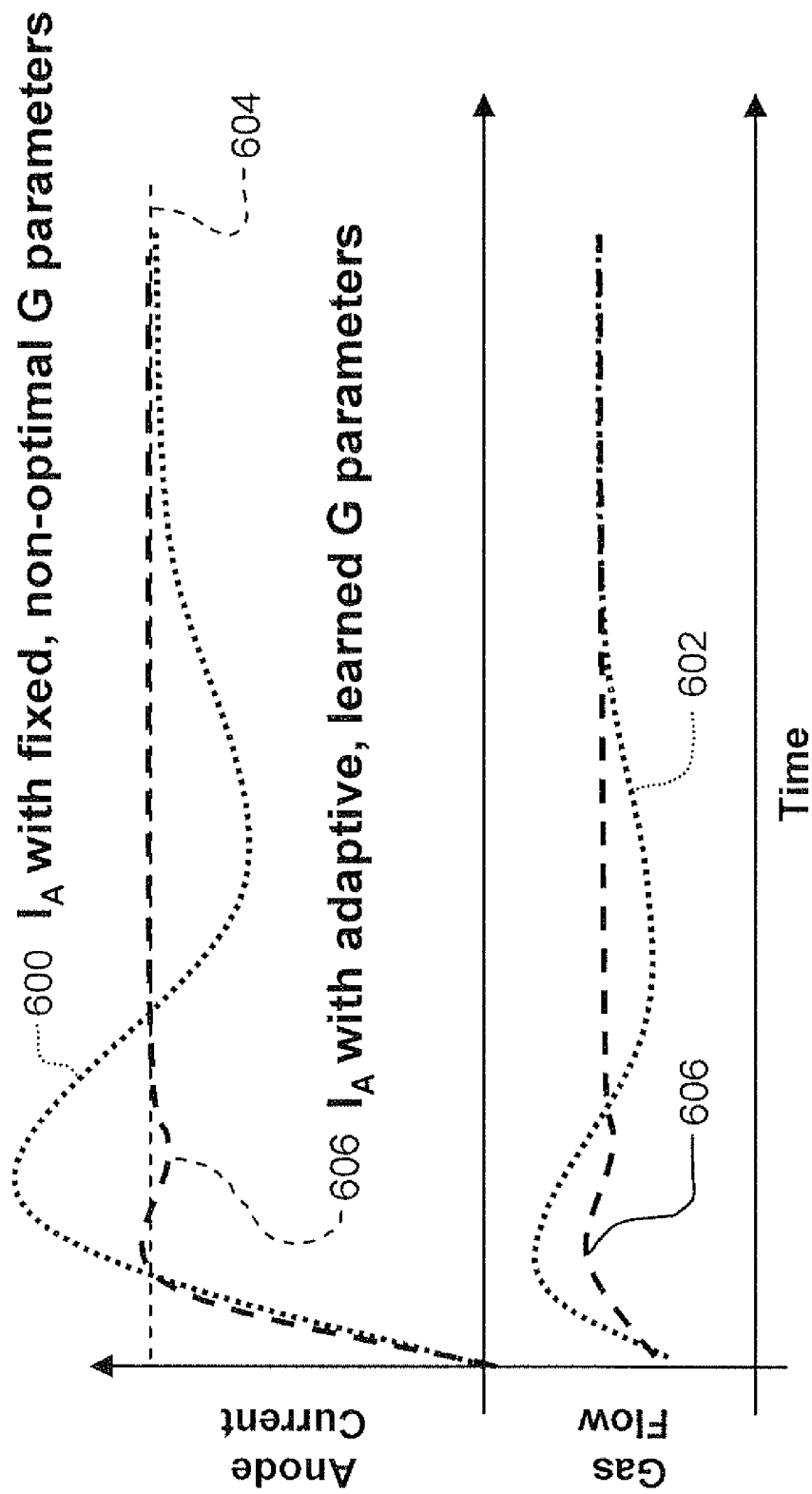
FIG. 6 is an illustrative plot comparing a typical ion source dynamic response to step-wise "on" operation with (A) fixed, closed-loop control parameters and (B) adaptive, closed-loop control parameters.

FIG. 6 shows the typical improvement in temporal ion source response achieved with an adaptive, closed-loop control system. In this illustration, a gridless, end-Hall ion source is turned on at the beginning of a process operation with fixed, non-optimal gain values of closed-loop control parameters. Thus, the effective control of the anode discharge current response $I_{Actual}$ 600 is clearly under-damped given the gas flow control signal 602 and considerable time (typically >10 seconds) is required for the ion source response to reach steady-state conditions 604. In a typical process this response is unacceptable since the working ion current density to a substrate is directly proportional to $I_{Actual}$.

Given this under-damped dynamic, operators would perceive the initial output properties of the ion source to be out of control and suspect that any substrate material properties achieved at the advent of a manufacturing process step (e.g., material interface, interlayer, or initial thin film deposition) would be inhomogeneous or inconsistently formed. By contrast the use of an adaptive, closed-loop control approach allows the ion source controller to sense the control state of the ion source and improve the response by making adjustments to parameters G in real time. The dynamic response of the gas flow 606 results in improved current response 608 and, in principle, translates into more homogenous and consistent substrate process results.

Figure 7:
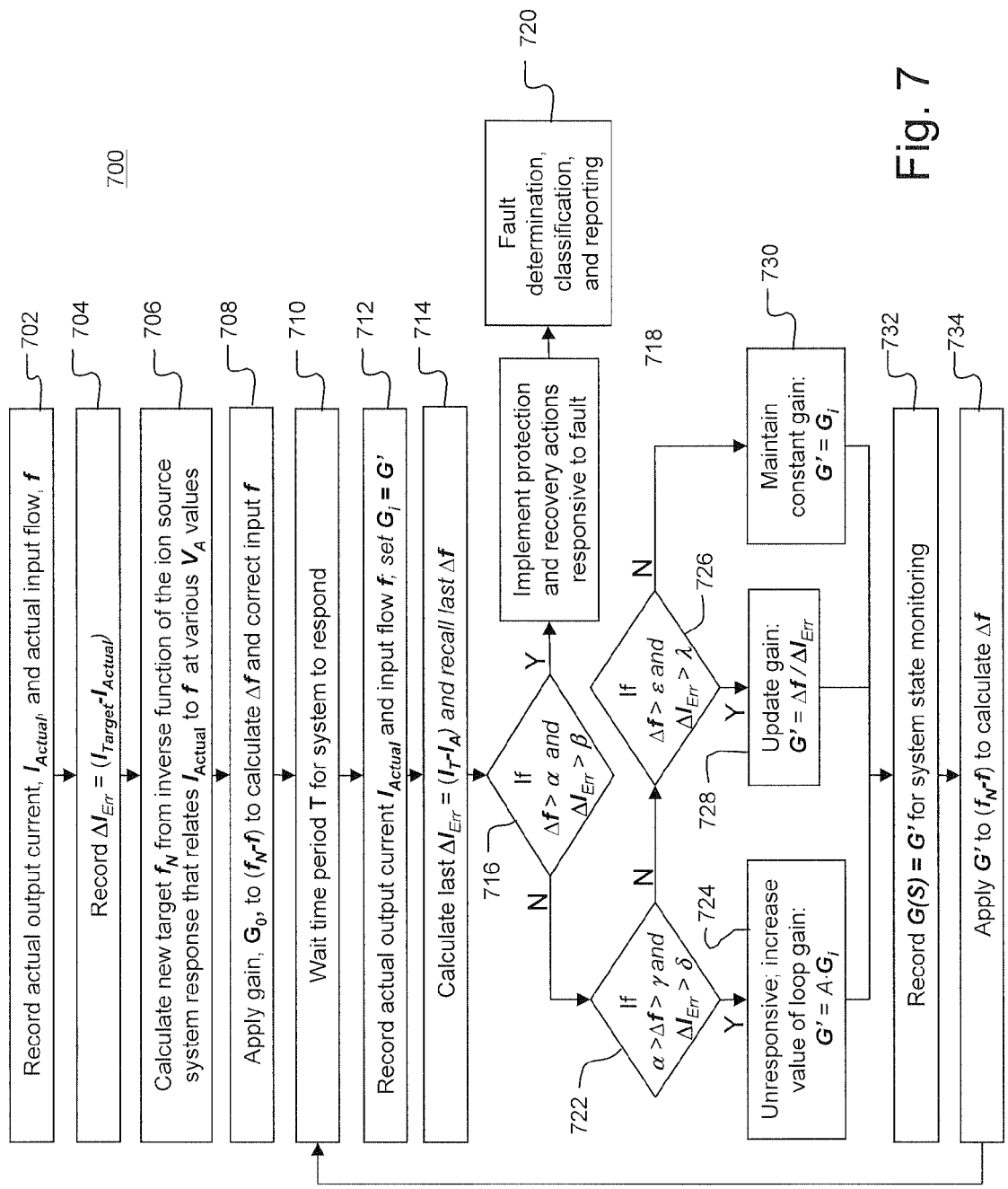
FIG. 7 is a flow diagram of an implementation of an embedded ion source controller algorithm for selection of adaptive, closed-loop control parameters and fault detection.

FIG. 7 is a flow chart 700 that illustrates one example of how the adaptive closed-loop may be realized in computer readable instructions, for example, saved to the firmware of an end-Hall ion source controller. The process begins by recording the actual output current $I_{Actual}$ and gas flow f read back from the MFC in operation 702. Note that MFCs often have non-ideal time dynamic responses. Thus, it may be more beneficial to read-back the actual gas flow of the MFC device rather than assume an ideal response to user inputs. From the actual response readings, $\Delta I_{ERR}$, which is the difference between the target current $I_{Target}$ and the actual output current $I_{Actual}$ as described above with respect to FIG. 5, may be calculated in operation 704. Next a target value of $f_N$ and an estimated error $f_{ERR}$ may be calculated based on a system response model that relates $I_{Actual}$ to f at various values of $V_A$ in operation 706 (e.g., a linear difference function such as $I_{Target}=I_{Actual}+G(f_N-f)$, or an inverse system transfer function that is either theoretically or empirically derived). The value $f_{ERR}$ (i.e., $f_N-f$) is then applied through an initial loop, conditioning parameters $G_0$ to provide the conditioned feedback value $\Delta f$ of the input gas flow in operation 708.

The system then waits for a discrete time period T to allow the ion source system to respond to the adjusted input(s) in operation 710. At this point no attempt is made to re-estimate or change the values of $G_0$. After time period T, the actual output response ($I_{Actual}$ and f) of the ion source is recorded and the latest set of parameters $G_i$ are now set to G' in operation 712. (For the initial loop, G' will be $G_0$.) A new value of $\Delta I_{ERR}$ is determined against the last flow correction $\Delta f$ in operation 714.

Selection rules are then applied in order to categorize the state of the ion source response and to determine whether the current state is or is not a fault as well as categorize the fault. For example, the magnitude of $\Delta f$ and $\Delta I_{ERR}$ may be compared to preset bounds of $\alpha$ and $\beta$ to determine if the ion source discharge current is large enough to indicate an anode short or arc fault in operation 716. Should a fault be sensed, the controller may implement a set of protection or recovery actions in operation 718 that are intended to protect the ion source, power supply, or process from damage due to an un-controllable state or failed condition. The recovery actions may also include additional fault detection, classification, and reporting actions to identify, record, and report the faulting event in operation 720

The values of $\Delta f$ and $\Delta I_{ERR}$ may also be compared to preset bounds of $\mu$ and $\gamma$, and $\delta$ respectively in operation 722, to determine whether the resulting change in ion source operation is too small compared to the current control parameters, $G_i$. If so, the gain may be increased (and or phase constants adjusted) in operation 724 in order to bring the system control out of an unresponsive, highly over-damped, or lagging state. If no gain increase is required, the values $\Delta f$ and $\Delta I_{ERR}$ may be compared to preset bounds of $\in$ and $\lambda$, respectively, in operation 726 to determine whether responses to the system are scaled sufficiently to calculate a new G'. If the scaling is appropriate, a new G' is calculated based on the ratio of $\Delta f$ and $\Delta I_{ERR}$ in operation 728.

If pursuant to the system value comparisons in operations 716, 722, and 726, no fault is detected and the gain does not need to be increased or otherwise updated, a constant gain is maintained and G' is set to $G_i$. Next, the value of the control parameters G' may be recorded as system state parameters G(S) in operation 732 at a particular time interval as a means of monitoring the system state. A new correction to the input flow may be estimated and a new $\Delta f$ may be applied to the input flow(s) through the updated control parameters G' in operation 734 before returning to operation 710 to time out for the time period T before cycling through the loop again. Although in this illustration input adjustments are only made at the end of time period T concurrent with the changes to control parameters G', the closed-loop control adjustments to the source inputs may be applied continuously during time period T or may be applied at the rate of incoming feedback data at any time during time period T. It should be noted that the value of T may also be part of the adaptable control parameters and employed as another exemplary method to further adjust the responsiveness and sensitivity of the adaptive, closed-loop control algorithm.

A fault event 716 may be any detectable, abnormal, temporal response in the ion source output property that is being controlled or in a suggested input change or adjustment to the control parameters that suggests the source is in a fault state (even if the ion source system can recover from any such a fault). In manufacturing it is helpful to identify, classify, count the frequency of, and report the occurrence of such faults, especially when such events correlate to poor process performance or repeatability. This may indicate a failing ion source component that requires preventative maintenance or alarms the user that ion source cannot operate stably robustly under the current conditions or system environment presented. One example of reported faults may be an unexpected change in an ion source output current, voltage, or impedance property as related to an input power module input change. Another example of a fault may be an unresponsive ion source system or sub-component that fails to enable control of the ion source system (e.g., a failing MFC, faulty power supply, faulty process sensor, worn or coated ion source electrode or coil, or a failing electron source neutralizer).

Figure 8:
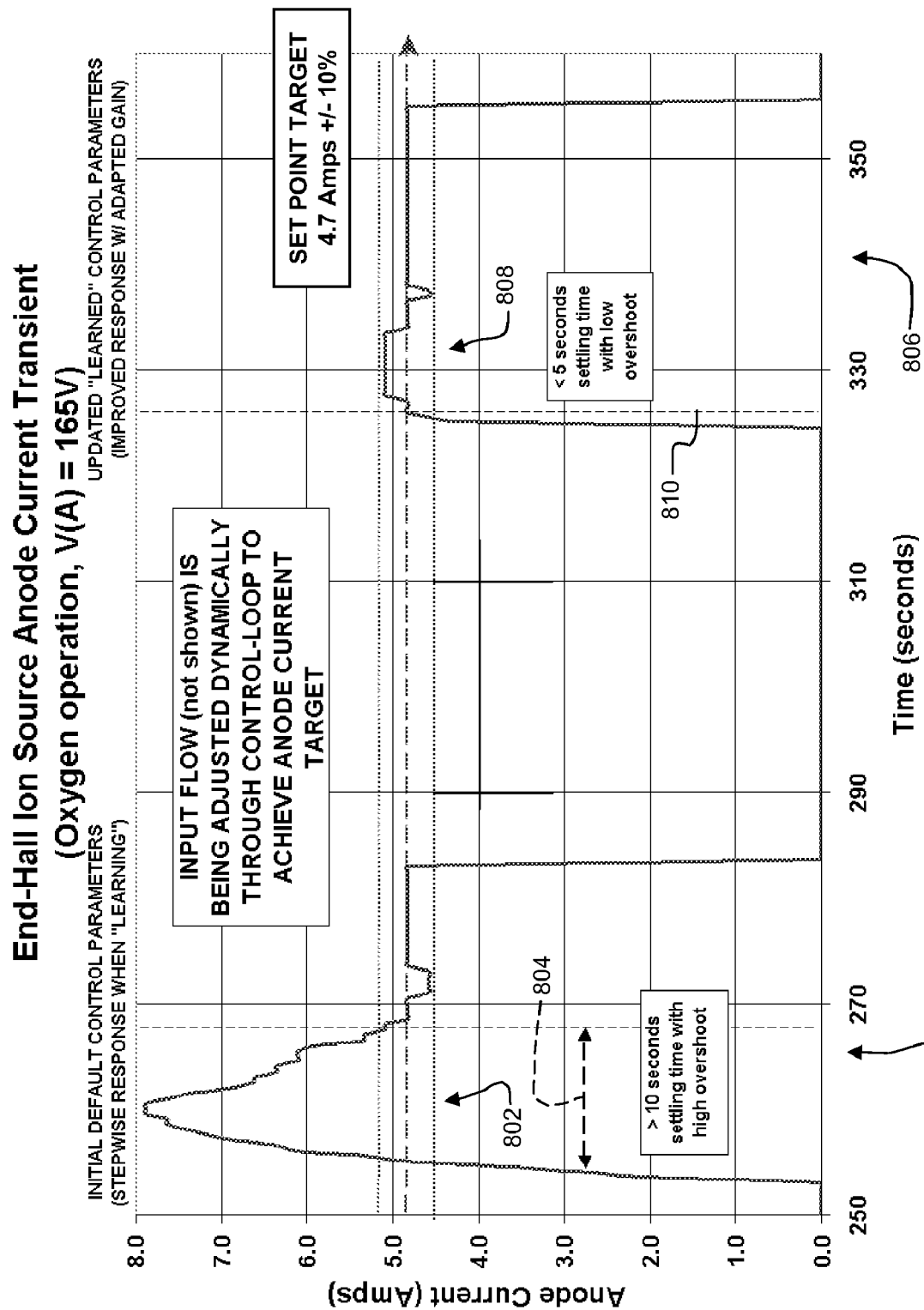
FIG. 8 is an illustrative plot of an end-Hall ion source discharge current response to start-up operation with (A) fixed, default closed-loop control parameters and non-optimal pre-sets and (B) with adaptive, closed-loop control parameters and optimal pre-sets.

FIG. 8 shows an example of one implementation of an adaptive, closed-loop for a gridless end-Hall ion source controller. In this example, the ion source was a commercial Veeco Instruments Mark II+ ion source with a hollow-cathode electron source driven by a commercial Veeco Instruments Mark III+ Ion Source Controller updated with the adaptive, closed-loop technology disclosed herein and MFC calibrated for oxygen operation. The ion source set points were $V_{ANODE}$=165 V, $I_{ANODE}$=4.7 Amps, and $I_N$=0.2 Amps. The initial setting for the gas flow was approximately 15-17 standard cubic centimeters per minute.

In the first instance of operation 800 the controller began with factory default control parameters. The results in FIG. 8 indicate a large overshoot 802 and long settling time 804. These results suggest that the initial gain settings associated with the default parameters were not ideal for the step-input operation of the end-Hall source. Even with the real-time adaptive adjustments to control parameters, there is a sizable overshoot that cannot be readily corrected and the settling time to the target window is >10 seconds.

However, through this initial "learning" sequence, the adaptive, closed-loop ion source controller adopted improved control parameters. This is evident in a subsequent run 806, wherein the overshoot is muted 808 and the rise time 810 to the target current window is only a few seconds. Thus the adaptive, closed-loop algorithm allows the controller to learn the step-wise response of the system and adopt new initial adaptive, closed-loop control parameters. If desired, these learned parameters may be logged, catalogued, and saved in a non-volatile memory of the ion source controller and applied when the step-wise sequence is encountered again.

Moreover, one may operate the ion source over an envelope of initial step-input conditions within a specific material process system, record the adapted control parameters as a response in itself, and generate an empirically-based control-parameter response surface for the test envelope of ion source operation. Such a stored record or derived response surface set of control parameters may then be used by the ion source controller to better pre-select initial control loop parameters when the operating conditions of the ion source are shifted within the envelope of the response surface.

Other control problems encountered in broad-area ion sources may be in-process disruptions that perturb the steady-state ion source operation. Examples of such disruptions may include minor arcs, discrete adjustments to the vacuum pump gate valve, or the motion of process shutters used for the ion beam or depositing electronic-beam evaporator or magnetron sputter source.

Figure 9:
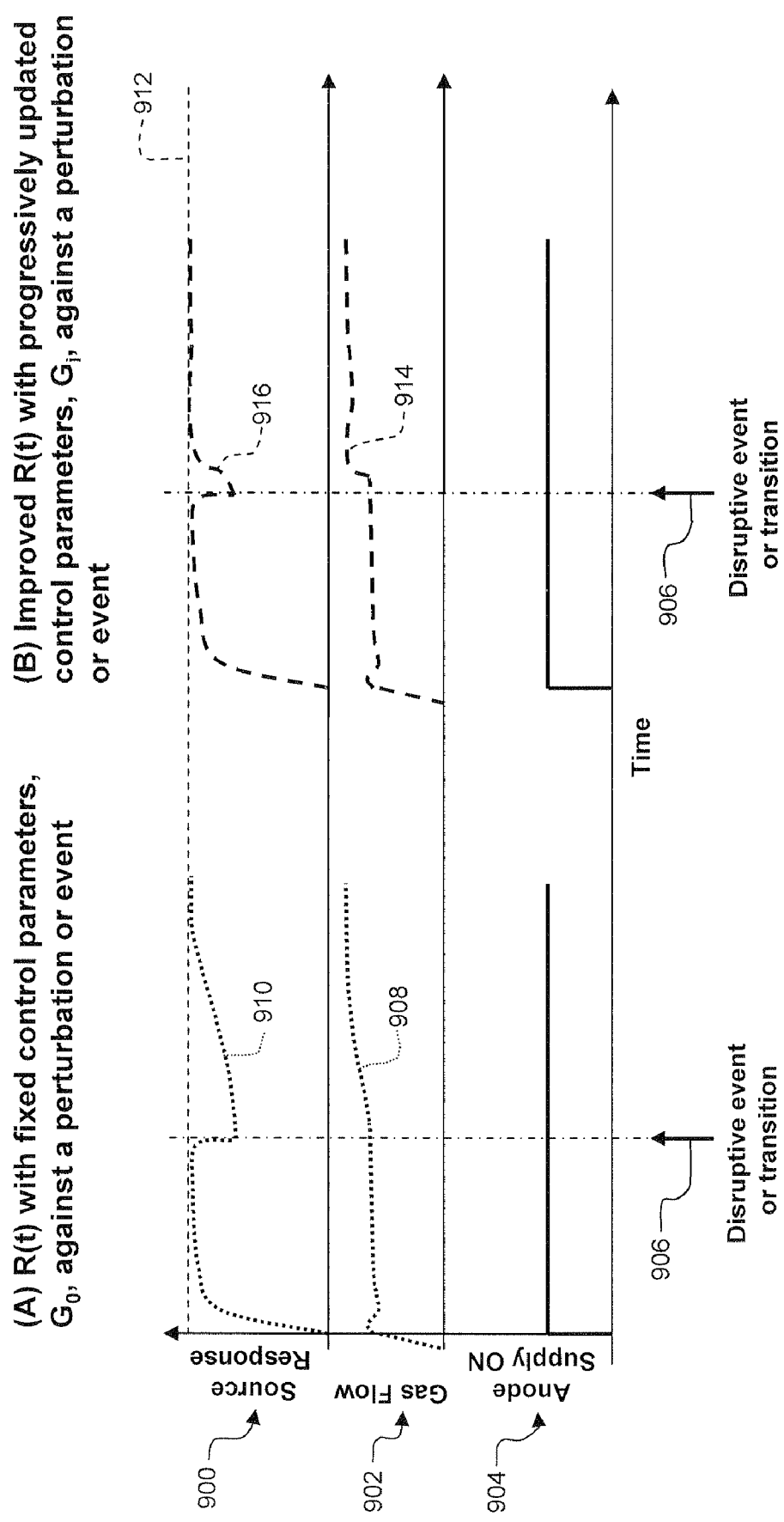
FIG. 9 is an illustration of a dynamic response by an ion source to a momentary disruption of the process system state with (A) fixed, default closed-loop control parameters and (B) with adaptive closed-loop control parameters.

FIG. 9 illustrates how the ion source response 900, R(t), may be impacted during a disruption event or transition 906 when the control parameters are fixed (A) and how the ion source response is improved when the control parameters progressively updated in real-time (B). When process parameters are fixed (A), the in-process disruption produces a relatively small but significant shift in the output response 910. If the default gain of the fixed control loop parameters is low, the recovery 910 to the disruption 906 through changes 908 in gas flow 902 may be sluggish because the magnitude of any Δf for each discrete period T is small. However, if the control loop parameters are progressively updated in real-time (B), the gain can be increased (within bounds) to increase the feedback 912 in the gas flow 904 and thereby shorten the recovery 914 from the in-process disruption 906 in the response 900 of the ion source.

Figure 10:
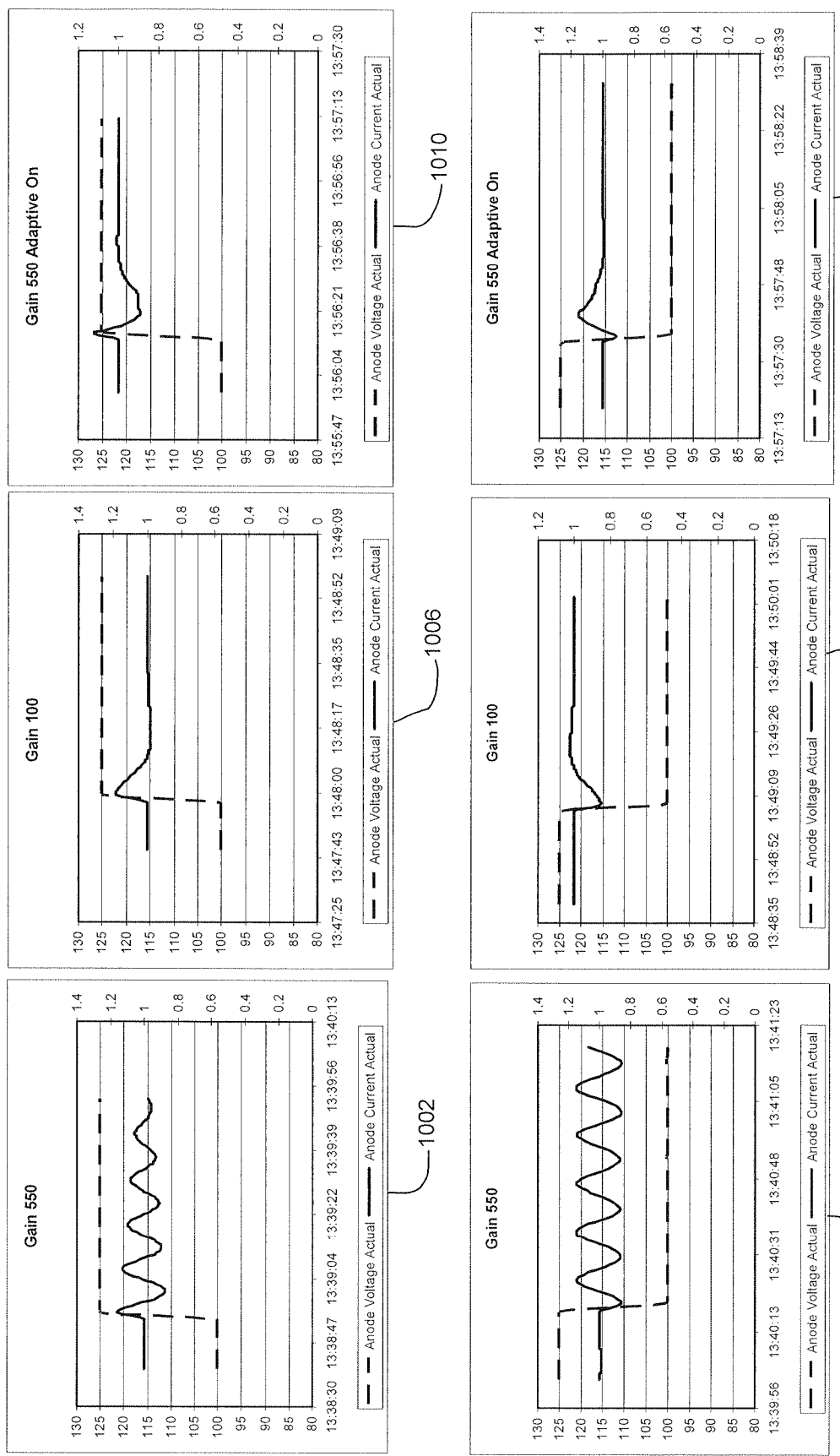
FIG. 10 is an illustration of dynamic responses by an ion source to changes in anode voltage with both a fixed, closed-loop control system at high and low gain settings and the response with an adaptive closed-loop control system with an initial high gain setting.

FIG. 10 is another illustration of benefits achieved using an adaptive closed-loop control. The first set of plots labeled "Gain 550" indicates the effect on the anode current upon a step up in anode voltage 1002 and a step down in anode voltage 1004 in a fixed, closed-loop system with a high gain setting. In each case there is a high oscillation (unstable control) when the fixed closed-loop gain is set high. The second set of plots labeled "Gain 100" indicate the effect on the anode current upon a step up in anode voltage 1006 and a step down in anode voltage 1008 in the same fixed, closed-loop system with a low gain setting. This gain setting was empirically found and verified in order to produce the depicted results. In this particular system, the lower gain shows a more controlled response when the fixed closed-loop gain is set low. The third set of plots labeled "Gain 550 Adaptive On" indicates the effect on the anode current upon a step up in anode voltage 1002 and a step down in anode voltage 1004 in the same system substituting an adaptive, closed-loop control with a high gain setting. The adaptive, closed-loop control initially begins with a high gain value associated with Gain 550, automatically adapts lower gain values, and ultimately results in a well controlled response without having to first search for and verify a specific closed-loop gain value.

Figure 11:
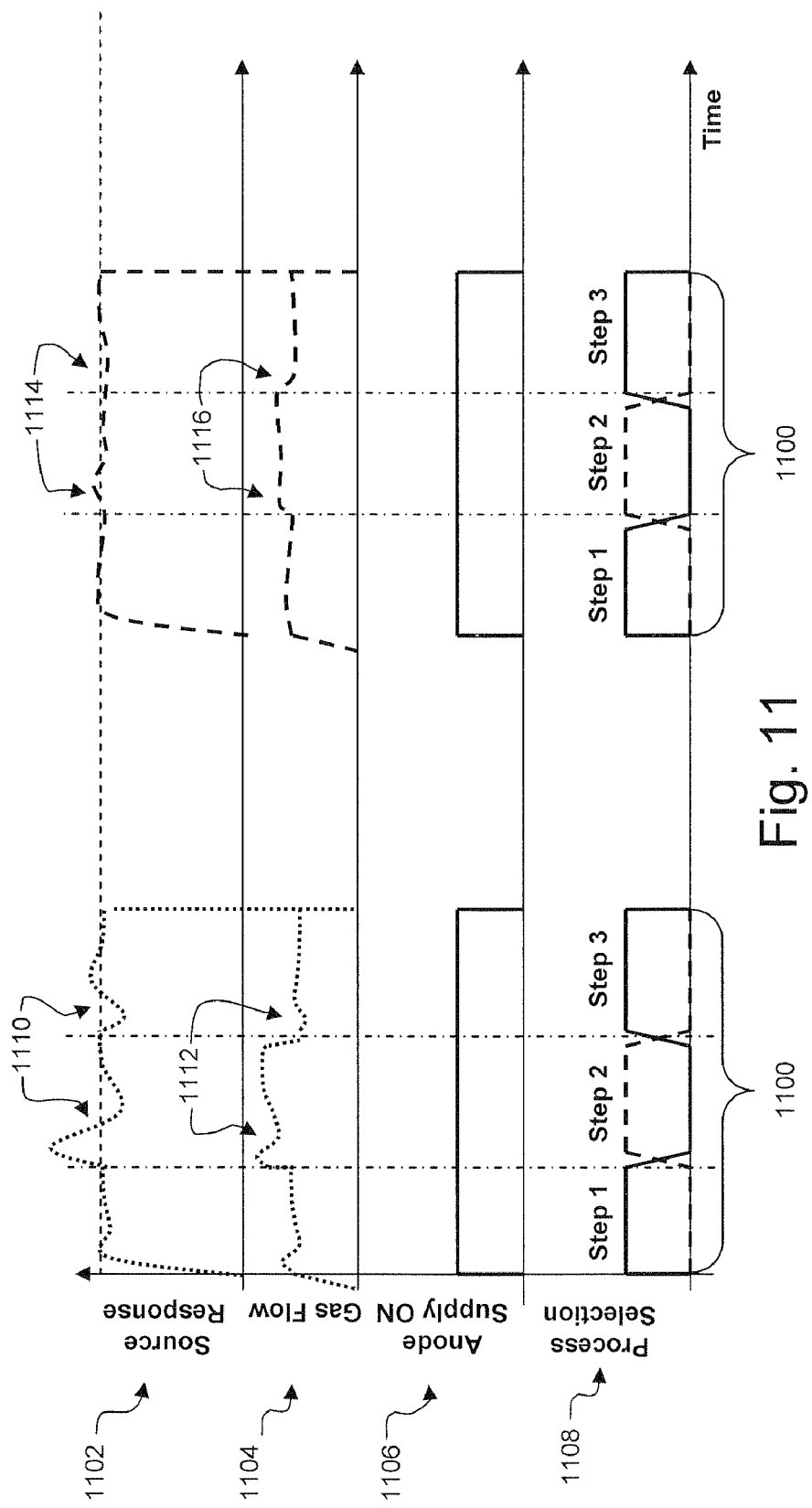
FIG. 11 is an illustration of a dynamic response by an ion source to a step-wise change in input process gas condition or composition with (A) fixed, default closed-loop control parameters and (B) with adaptive, closed-loop control parameters.

Yet another exemplary control problem may occur when a process step change occurs, e.g., from a change in gas chemistry or source operation set point. Often such step changes and transitions are applied while the ion source power is continuously applied. Such a case is illustrated in FIG. 11 wherein multiple step changes 1100 are applied during the course of a process 1102. A common example of such a change 1100 in a process 1102 might occur when the input gas chemistry is switched between a surface pre-clean step using an inert gas like argon to a ion beam deposition assist step using oxygen. Often changes to the ion source power setting 1104 accompany these process step changes and transitions, although in the example of FIG. 11, the power setting is stable throughout the process 11102.

When control parameters are fixed (A) and the process step 1100 dictates a sizable change in discharge impedance, the recovery 1010 in the source response 1108 from the process step change by adjustments 1112 to the gas flow 1106 can be sizable and can occur at each transition. As such, the use of fixed, default closed-loop control parameters can result in poor closed-loop control because one set of control parameters may not be optimal for all possible dynamic transitions between process steps 1100.

In contrast, the adaptive, closed-loop control algorithm with real-time adaptation of the control parameters (B) provides dynamic adjustment of the closed-loop performance throughout multiple process steps and transitions 1100. With such adaptive control, the response 1114 through the step transitions 1100 may be made smoother through improved feedback of the input gas flow(s) 1116 as shown in part (B) of FIG. 11.

Figure 12:
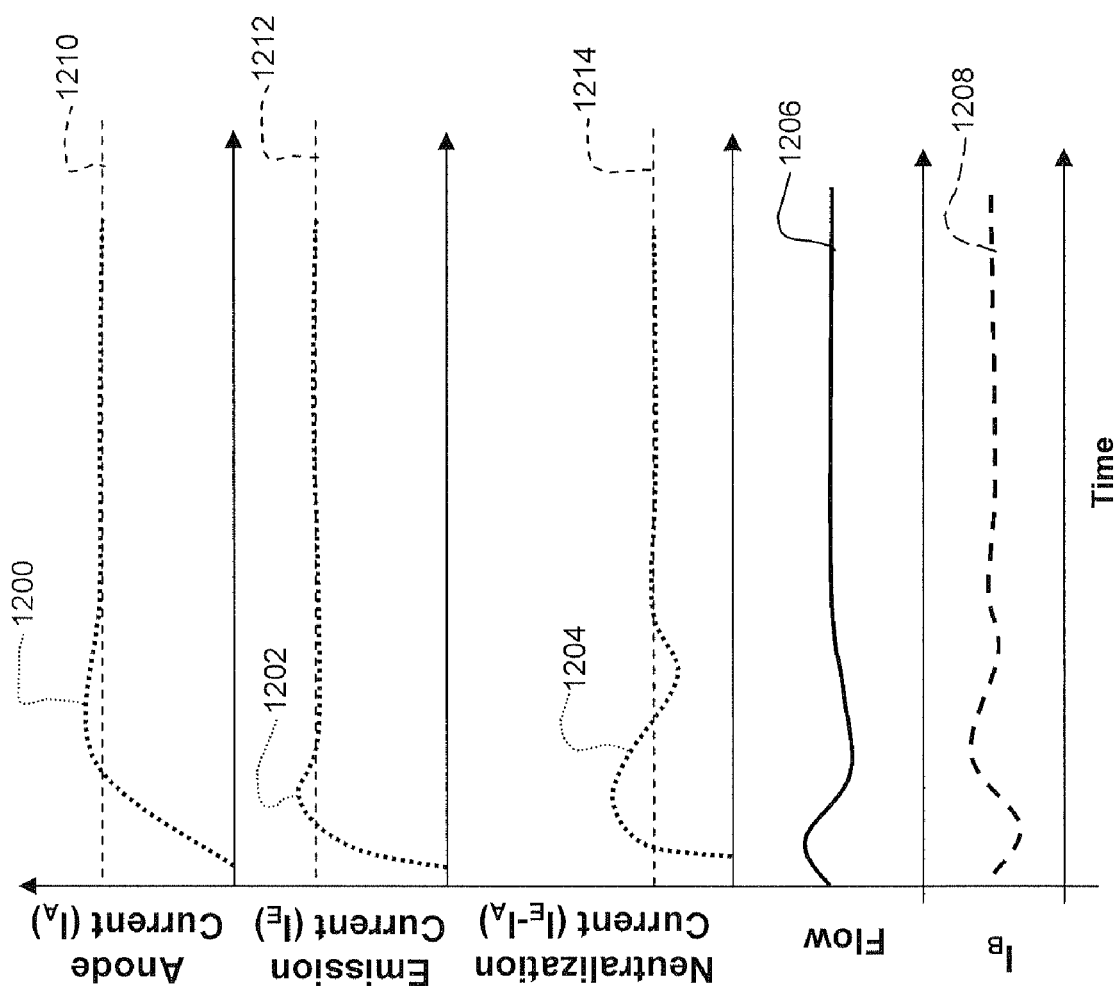
FIG. 12 is an illustration of a dynamic response by an ion source to an adaptive close-loop control system controlling multiple input variables.

Further using the example of the end-Hall ion source, FIG. 12 illustrates how multiple control variables may be used to provide adaptive close-loop control for improved dynamic control of multiple responses of the ion source. In this case, the response of anode current $I_{Anode}$ 1200 and emission current $I_{Emission}$ 1202 of the ion source cathode are to be controlled so as to also control the neutralization current $I_{Neut.}$ 1204 (where $I_{Neut.} = I_{Emission} - I_{Anode}$). Note that it is desirable to control the neutralization current $I_{Neut}$ to a viable positive value to provide excess cold electrons into the system and thereby avoid charging damage to target and substrate materials downstream of the ion source. Using both gas flow 1206 (with slow time response) and an electromagnet drive $I_B$ 1208 (with fast time response) as feed-back control variables, it is possible to obtain effective target values 1210, 1212, and 1214 for anode current, emission current, and neutralization current, respectively, and track desired steady-state values of $I_{Anode}$, $I_{Emission}$, and thus $I_{Neut}$. If provided with a well-conditioned set of feedback parameters, the multivariable control approach provides control over multiple ion source operating output states with more freedom than can be obtained with any single-variable, closed-loop feedback method. Furthermore, a multivariable, closed-loop feedback approach as illustrated in FIG. 12 can utilize the adaptive algorithms as illustrated with single variable, closed-loop, feedback and control.

While the illustrated improvements given above are specific to a broad-area, gridless ion source apparatus, they may be applied to other broad-area ion or plasma sources used in a material processing systems that typically require closed-loop control features to control the dynamic response or performance. Also, while the specific implementation of the adaptive closed-loop algorithm disclosed herein focuses on a single-variable input-output system, it should be understood that other implementations may be constructed to achieve the same or similar result and that these principles may be expanded to multi-variable input-output systems used for ion source operation and control.

The technology described herein may be implemented as logical operations and/or modules in one or more systems. The logical operations may be implemented as a sequence of processor-implemented steps executing in one or more control systems and as interconnected machine or circuit modules within one or more control systems. Likewise, the descriptions of various component modules may be provided in terms of operations executed or effected by the modules. The resulting implementation is a matter of choice, dependent on the performance requirements of the underlying system implementing the described technology. Accordingly, the logical operations making up the embodiments of the technology described herein are referred to variously as operations, steps, objects, or modules. Furthermore, it should be understood that logical operations may be performed in any order, unless explicitly claimed otherwise or a specific order is inherently necessitated by the claim language.

The above specification, examples and data provide a complete description of the structure and use of exemplary embodiments of the invention. Although various embodiments of the invention have been described above with a certain degree of particularity, or with reference to one or more individual embodiments, those skilled in the art could make numerous alterations to the disclosed embodiments without departing from the spirit or scope of this invention. In particular, it should be understand that the described technology may be employed independent of a personal computer. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

What is claimed is:

1. A system for adaptively controlling output properties of an ion source comprising
feedback circuitry that receives feedback data including a discharge current response error and an input gas flow measurement and updates a gain parameter based upon the feedback data; and
control circuitry that receives and processes the updated gain parameter to dynamically adjust a gas flow regulator that regulates gas flow to the ion source to provide a stable ion source output property response against ion source process changes.

2. The system of claim 1 further comprising
a memory that stores the updated gain parameter; and wherein
the feedback circuitry further develops a new updated gain parameter based upon the feedback data and the stored updated gain parameter.

3. The system of claim 2, wherein the memory further stores an initial gain parameter determined by the control circuitry to provide the stable ion source output property response for a particular system environment.

4. The system of claim 1 further comprising one or more process sensors that provide feedback data to the feedback circuitry regarding a state of a system environment of the ion source.

5. The system of claim 1, wherein the control circuitry further controls output of power from a power supply to the ion source to provide the stable ion source output property response, wherein the ion source is a gridless ion source having one or more of the following output properties: ion beam current; ion source DC, AC, or RF current; ion source DC, AC, or RF voltage; ion source DC, AC, or RF impedance; ion source emission current; or ion source neutralization current.

6. The system of claim 1, wherein the control circuitry further controls output of power from a power supply to the ion source to provide the stable ion source output property response, wherein the ion source is a gridded ion source having one or more of the following output properties: ion beam current; ion source discharge DC, AC, or RF current; ion source discharge DC, AC, or RF voltage; ion source discharge DC, AC, or RF impedance; ion source emission current; ion source neutralization current; ion beam grid extraction system current; or ion beam grid extraction system voltage.

7. The system of claim 1, wherein the feedback data further includes a neutralization current or neutralization voltage measurement.

8. The system of claim 1, wherein the discharge current response error includes a difference between an anode current measurement and a target anode current value.

9. The system of claim 1, wherein the gain parameter is further updated based on a comparison of the discharge current response error with one or more preset bounds.

10. The system of claim 1, wherein the control circuitry further calculates a feedback correction value between the input gas flow measurement and a target gas flow value.

11. The system of claim 10, wherein the gain parameter is further updated based on a comparison of the feedback correction value with one or more preset bounds.

12. A system for adaptively controlling output properties of an ion source comprising
feedback circuitry that receives feedback data including a discharge current response error and an input gas flow measurement and updates a gain parameter based upon the feedback data; and
control circuitry that receives and processes the updated gain parameter to dynamically adjust one or more of the following:
a gas flow regulator that regulates input gas flow to the ion source,
power from a power supply to a cathode in the ion source, or
power from the power supply to a cathode in the ion source,
to provide a stable ion source output property response against ion source process changes.

13. The system of claim 12 further comprising
a memory that stores the updated gain parameter; and wherein
the feedback circuitry further develops a new updated gain parameter based upon the feedback data and the stored updated gain parameter.

14. The system of claim 13, wherein the memory further stores an initial gain parameter determined by the control circuitry to provide the stable ion source output current response for a particular ion source system environment.

15. The system of claim 12, wherein the control circuitry further controls power output from the power source to an electromagnet in the ion source to provide the stable ion source output property response against process changes.

16. The system of claim 12, wherein the control circuitry further controls output of power from a power supply to the ion source to provide the stable ion source output property response, wherein the ion source is a gridless ion source having one or more of the following output properties: ion beam current; ion source DC, AC, or RF current; ion source DC, AC, or RF voltage; ion source DC, AC, or RF impedance; ion source emission current; or ion source neutralization current.

17. The system of claim 12, wherein the control circuitry further controls output of power from a power supply to the ion source to provide the stable ion source output property response, wherein the ion source is a gridded ion source having one or more of the following output properties: ion beam current; ion source discharge DC, AC, or RF current; ion source discharge DC, AC, or RF voltage; ion source discharge DC, AC, or RF impedance; ion source emission current; ion source neutralization current; ion beam grid extraction system current; or ion beam grid extraction system voltage.

18. The system of claim 12, wherein the feedback data further includes a neutralization current or neutralization voltage measurement.

19. The system of claim 12, wherein the feedback data further includes an electromagnet input current measurement.

20. The system of claim 12, further comprising one or more process sensors that provide the feedback data to the feedback circuitry regarding a state of a system environment of the ion source.

21. The system of claim 12, wherein the feedback data further includes process sensor data regarding a state of a system environment of the ion source.

22. A system for controlling output properties of an ion source having an electromagnet, the system comprising
feedback circuitry that receives feedback data including a discharge current response error and an input gas flow measurement and updates a gain parameter based upon the feedback data; and
control circuitry that receives and processes the updated gain parameter to dynamically control power output from a power source to an electromagnet in the ion source to provide a stable ion source output property response against process changes.

23. The system of claim 22, wherein the control circuitry further adjusts a gas flow regulator that regulates gas flow to the ion source to provide the stable ion source output property response against process changes.

24. The system of claim 22 further comprising
a memory that stores the updated gain parameter; and wherein
the feedback circuitry further develops a new updated gain parameter based upon the feedback data and the stored updated gain parameter.

25. The system of claim 24, wherein the memory further stores an initial gain parameter determined by the control circuitry to provide the stable ion source output current response for a particular ion source system environment.

26. The system of claim 22, wherein the gain parameter comprises one or more variable values.

27. The system of claim 22, wherein
the control circuitry further receives fixed input values for one or more of the following:
input power to an anode in the ion source,
input power to a cathode in the ion source, or
input gas flow to the ion source; and
the control circuitry further processes the feedback data in conjunction with the fixed input values and the updated gain parameter to dynamically control the power output.

28. The system of claim 22, wherein the feedback data further includes an electromagnet input current measurement.

29. The system of claim 22, wherein the discharge current response error includes a difference between an anode current measurement and a target anode current value.

30. The system of claim 22, wherein the gain parameter is further updated based on a comparison of the discharge current response error with one or more preset bounds.

31. The system of claim 22, wherein the control circuitry further calculates a feedback correction value between the input gas flow measurement and a target gas flow value.

32. The system of claim 31, wherein the gain parameter is further updated based on a comparison of the feedback correction value with one or more preset bounds.

33. A method for adaptively controlling output properties of an ion source comprising
- receiving feedback data including a discharge current response error and an input gas flow measurement;
- developing an updated gain parameter based upon the feedback data; and
- processing the updated gain parameter according to a control algorithm to dynamically adjust one or more of the following:
  - a gas flow regulator that regulates gas flow to the ion source;
  - power from a power supply to an anode in the ion source;
  - power from the power supply to a cathode in the ion source;
  - power from the power supply to an electromagnet in the ion source,
  - power from the power supply to an electron neutralizing source;
  - power from the power supply to an ion beam grid extraction system in the ion source; or
  - power from the power supply to an RF electrode;

to provide a stable ion source output current response against changes or disruptions in process settings or conditions.

34. The method of claim 33 further comprising updating the gain parameter as a function of a ratio of a change in input gas flow and a resulting change in a value of one or more output properties of the ion source.

35. The method of claim 33 further comprising updating the gain parameter as a function of a ratio of a change in power to the electromagnet and a resulting change in a value of one or more output properties of the ion source.

36. The method of claim 33 further comprising repeating the receiving, developing, and processing operations after a discrete time period.

37. The method of claim 33 further comprising
- determining an occurrence of an ion source fault; and
- implementing protection and recovery actions in the ion source.

38. The method of claim 33 further comprising
- determining a gain value that provides the stable ion source output property response for a particular ion source system environment; and
- storing the gain value as an initial gain parameter.

39. A method for adaptively controlling output properties of an ion source comprising
- receiving feedback data including a discharge current measurement and an input gas flow measurement;
- calculating a response error between the anode current measurement and a target anode current value;
- calculating a feedback correction value between the input gas flow measurement and a target input gas flow value;
- applying an initial gain parameter to the feedback correction value to yield a feedback gain;
- comparing the response error and feedback gain to one or more preset bounds indicating that a closed-loop response of the ion source is un-responsive, under-damped, or over-damped; and
- updating the gain parameter responsive to the comparing operation.

40. The method of claim 39 further comprising
- comparing the response error and feedback gain to one or more preset bounds indicating a fault; and
- implementing recovery actions responsive to the comparing operation.

* * * * *

UNITED STATES PATENT AND TRADEMARK OFFICE
CERTIFICATE OF CORRECTION

PATENT NO. : 7,853,364 B2  Page 1 of 1
APPLICATION NO. : 11/947720
DATED : December 14, 2010
INVENTOR(S) : James D. Deakins et al.

It is certified that error appears in the above-identified patent and that said Letters Patent is hereby corrected as shown below:

In The Specification:

Column 5, line 64, delete "$(V_A)$" and insert --$(V_A)$.--, therefor.

Column 8, line 12, delete "MCSs" and insert --MFCs--, therefor.

Column 12, line 46, after "720" insert --.--.

Column 15, line 2, delete "11102." and insert --1102.--, therefor.

Column 15, line 33, delete "feed-back" and insert --feedback--, therefor.

In The Claims:

Column 19, line 16, in claim 33, delete "source," and insert --source;--, therefor.

Signed and Sealed this
Fifteenth Day of March, 2011

David J. Kappos
*Director of the United States Patent and Trademark Office*